United States Patent [19]

Meyer

[11] Patent Number: 5,500,629
[45] Date of Patent: Mar. 19, 1996

[54] NOISE SUPPRESSOR

[76] Inventor: Dennis R. Meyer, 17830 2nd. Ave., Plymouth, Minn. 55447

[21] Appl. No.: 398,050

[22] Filed: Mar. 2, 1995

Related U.S. Application Data

[63] Continuation-in-part of Ser. No. 119,989, Sep. 10, 1993, abandoned.

[51] Int. Cl.$^6$ .................................................. H03H 7/01
[52] U.S. Cl. ........................... 333/181; 333/185; 336/175
[58] Field of Search .............................. 333/12, 181–185; 361/311; 338/66, 20–22 R; 336/175, 176, 233; 174/32

[56] References Cited

U.S. PATENT DOCUMENTS

| | | | |
|---|---|---|---|
| 3,743,097 | 7/1973 | Fritz | 333/182 |
| 3,863,111 | 1/1975 | Martzloff | 317/61.5 |
| 4,042,420 | 8/1977 | Nishino | 148/6 |
| 4,646,037 | 2/1987 | Turolla et al. | 333/12 X |
| 4,698,605 | 10/1987 | Imamura | 333/184 |
| 4,796,079 | 1/1989 | Hettiger | 333/12 X |
| 4,841,259 | 6/1989 | Mayer | 333/245 |
| 4,873,505 | 10/1989 | Matsui | 333/12 X |
| 4,903,161 | 2/1990 | Huber | 361/56 |
| 4,992,060 | 2/1991 | Meyer | 439/620 |
| 5,182,540 | 1/1993 | Shuto et al. | 338/223 |

FOREIGN PATENT DOCUMENTS

| | | |
|---|---|---|
| 6012809 | 6/1983 | Japan . |
| 6429009 | 7/1987 | Japan . |

OTHER PUBLICATIONS

Snelling, "Soft Ferrites: Properties and Applications", 1988, pp. 33–35, 44–57, and 126.

*Primary Examiner*—Paul Gensler

[57] ABSTRACT

A distributed low-pass filter typically attenuating a signal, 7 db. at 10 MHz., 18 db. at 30 MHz., and continuing at 50 db/decade, without resonant inflections, uses a small, low cost, rectangular tubular bead of outside dimension 3 mm.× 6 mm.×2 mm., made from a body material having evenly distributed magnetic, dielectric, and resistive properties. A through-conductor completes the distributed filter which acts like a high loss cable transmission line. The tube's inner and outer surfaces are separately coated with an electrode material. The through-conductor electrically connects to the inner electrode, with its ends providing first and second filter terminals, and the outer electrode providing a common, terminal. An a.c. signal impressed between the first and common terminals produces an attenuated signal between the second and common terminals in accordance with the above characteristics. Also, a 6 mm.×6 mm.×1 mm block of the body material may typically form a 500 µF power-line, noise suppressor. The above devices may include bi-directional, zener-like, voltage limiter capability; absorbing noise and electrostatic discharges, like varistors. A preferred body material is a sintered mix of oxides of manganese and iron, modified by oxides of zinc, nickel, or other metals. This soft ferrite, ceramic adapts to make surface mounted devices. Small, low cost, RF noise suppressors, line terminators, or impedance matching filters for use in high frequency (baud rate) cable connectors may be molded individually, or integrated as multiple devices.

12 Claims, 2 Drawing Sheets

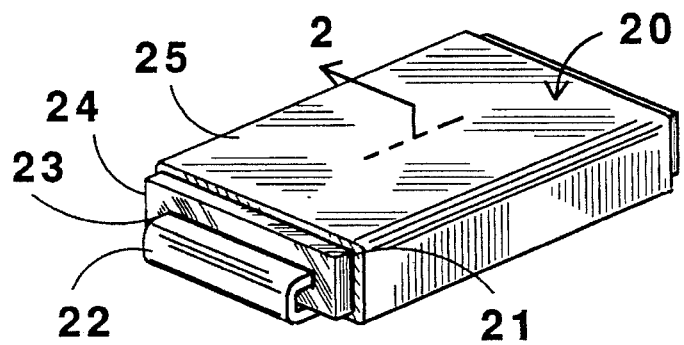
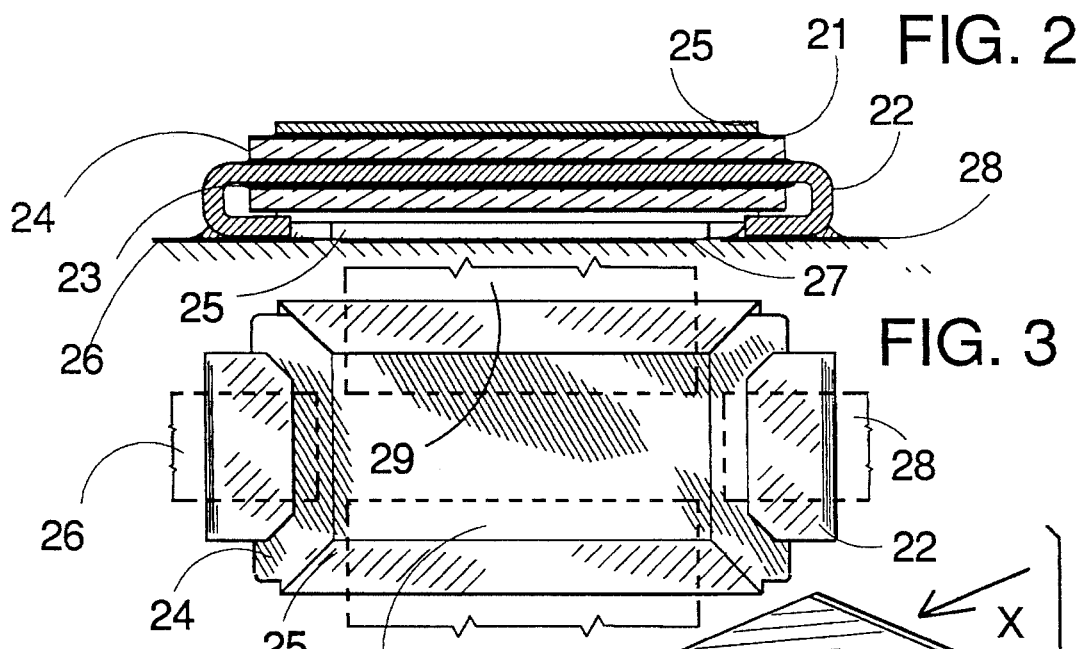
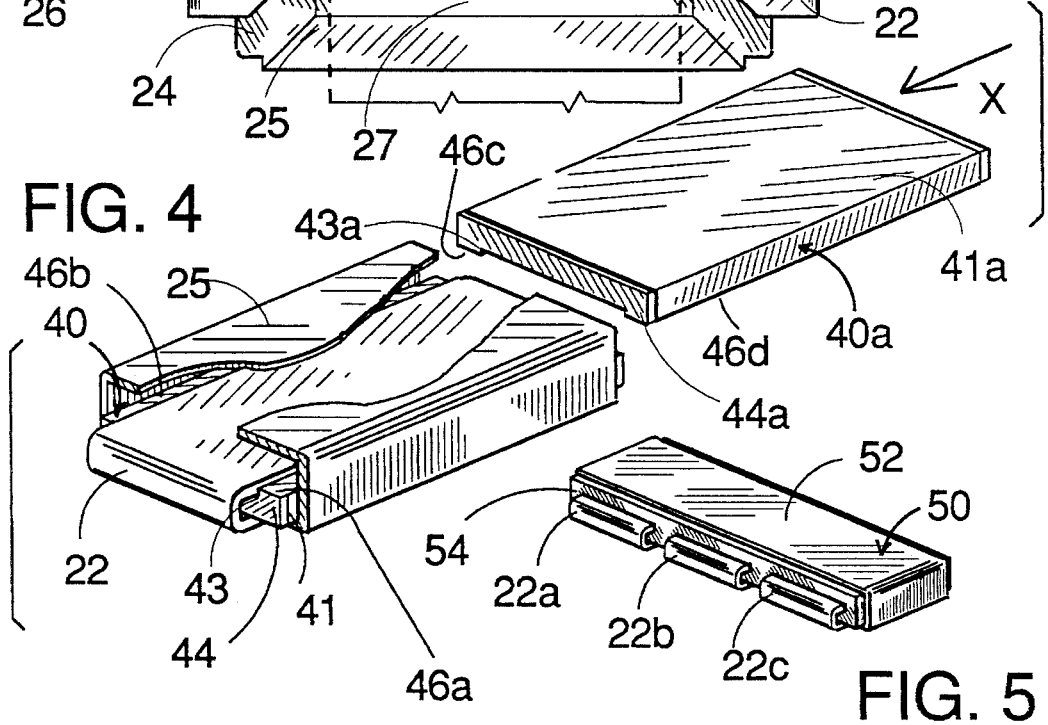

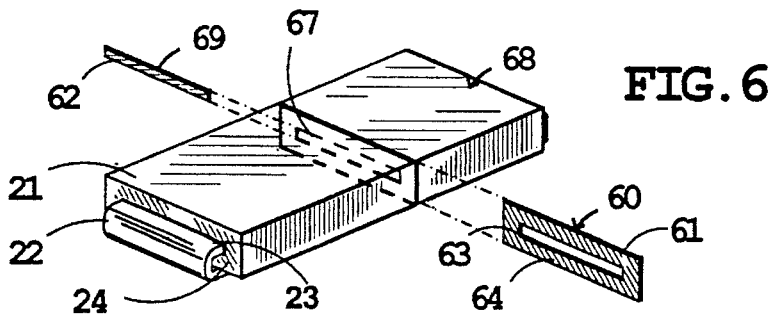
FIG. 6
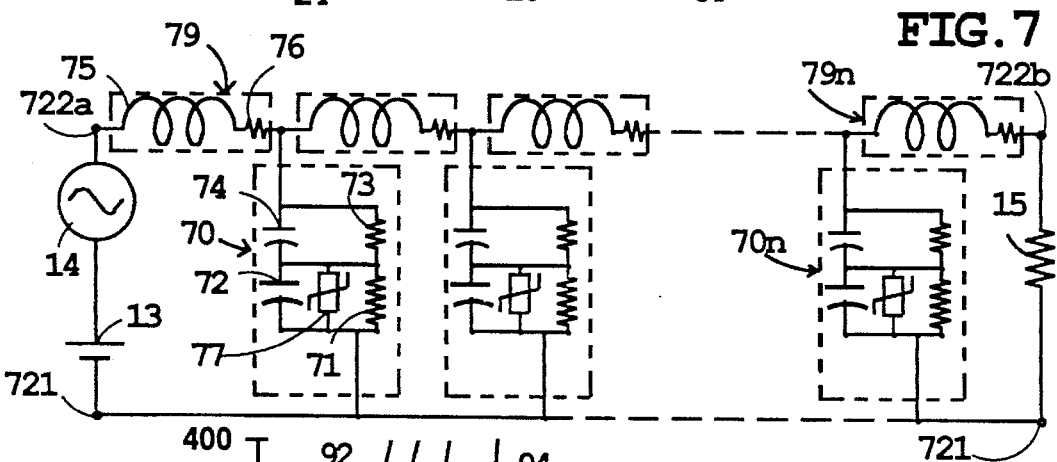
FIG. 7
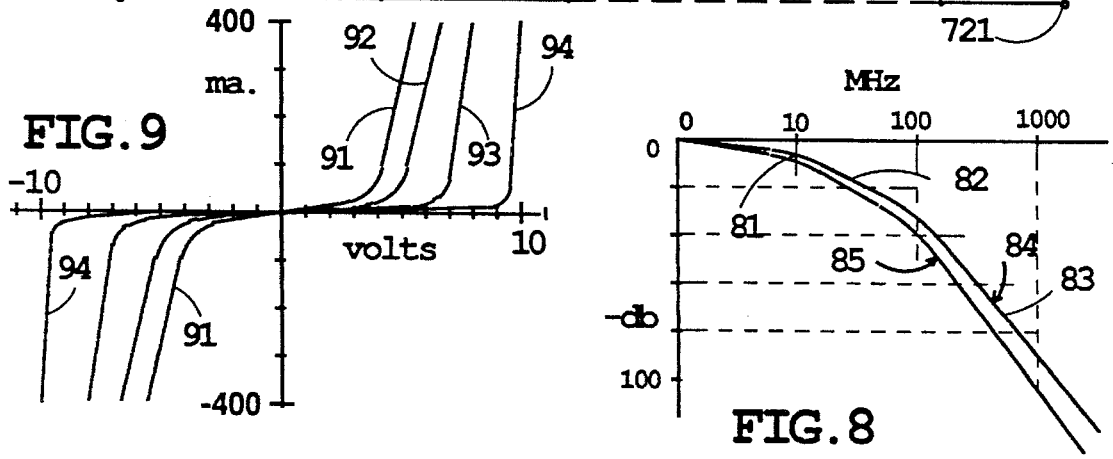
FIG. 9
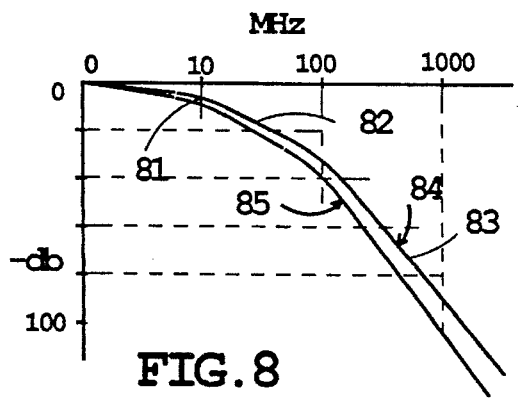
FIG. 8
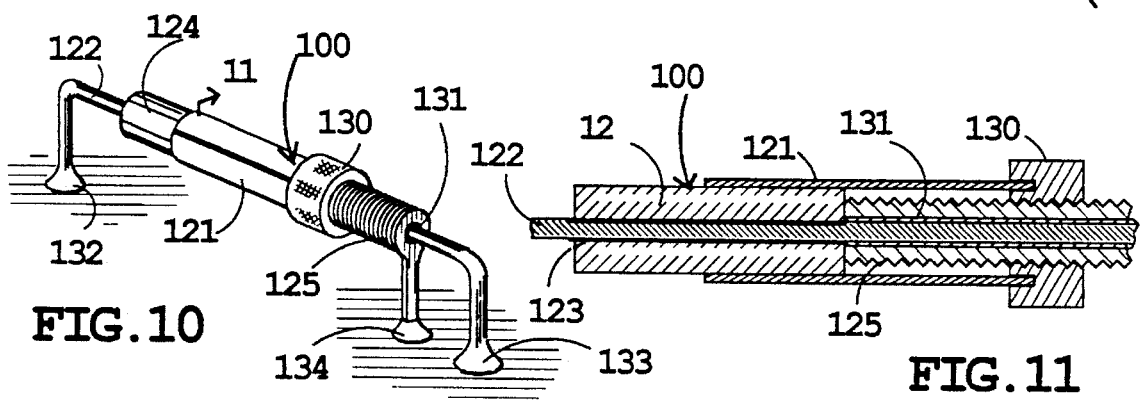
FIG. 10
FIG. 11

NOISE SUPPRESSOR

This is a continuation-in-part of U.S. patent application Ser. No. 08/119,989 filed, Sep. 10, 1993 by applicant, now abandoned.

BACKGROUND

The need for effective radio frequency (RF) noise filtering and circuit protection from surge voltages is urgently required due to the rapid growth, use, and reliance of the community at-large on electronic devices.

Emitters and receivers of unwanted signals are an increasing problem. Such devices as computers, heart stimulators, hearing aids, cellular phones, pagers, radio transmitters, facsimile machines etc. are all becoming smaller and increasingly operate at higher frequencies. High voltage electrostatic discharge noise is produced by lightning and by new synthetic materials used in machines, clothing, and furnishings.

Low cost, effective, noise suppression is especially needed where noise interference is life threatening, such as in aircraft controls, air-bag release circuits and controlled vehicle braking circuits. A recent typical example of this hazardous situation, is a commercial radio station which has rendered the electronic braking systems in automobiles on an adjacent highway totally inoperative.

Thus far, effective noise suppressors have been expensive and have added circuit complexity. Recent developments have concentrated on improved cable connector filtering, and feedthrough devices due to the special urgency in that area.

Presently the most effective noise filters combine ferrite inductors with lumped capacitors to form "L" or "π" filter networks. Uncontrolled self-inductance and self-capacitance resides within these costly lumped filters and produces resonance points which enhance certain noise frequencies thus reducing their effectiveness.

Prior art RF filters and by-pass capacitors have strived for electrical insulation by high DC resistance, setting the required inter-electrode resistivity to over 1 MΩ per cm. This has severely restricted the choice of dielectric materials which can be used for noise suppression.

Metal Oxide Varistors such as the GE-MOV® originally pioneered by the General Electric Company, Auburn, N.Y., and presently manufactured by Harris Semiconductor, 1301 Woody Burke Road, Melbourne, Fla. 32902 have proved to be useful for voltage transient protection. Their non-linear conduction characteristic and rugged power absorption protects electronic circuits from noise voltage transients. Made from silicon carbide, selenium, or zinc oxide, these devices cannot be used directly with high frequency signal lines. Their inherent high capacitance, swamps, distorts, and severely attenuates high frequency signals. Unless they are indirectly connected to the lines using inductors, zener diodes, gas discharge tubes, and the like, these isolation circuits add complexity, high cost, and severely compromise the effectiveness of the varistor.

It is apparent that a more effective, low cost, RF noise filter, is required. A varistor-like transient noise suppression feature included in that filter, which preserved the integrity of high frequency signals would solve many troublesome noise problems.

SUMMARY

To provide improved components which meet the needs discussed in the Background section it was necessary to discover a completely new type of body material unlike any used for noise suppressing or radio frequency (RF) filters in the prior art; bringing inductive, capacitive and resistive filtering elements together at the grain level.

The new material can be manufactured in a variety of forms to suit the circuit and packaging needs of the user. Embodiments of the invention described and shown in this disclosure show how two types of body material are made, and how a number of useful noise suppressing components are constructed. These include: capacitive by-pass devices, low-pass filters, and line terminators, which may also include voltage surge absorbing qualities.

The even distribution of properties in the body material when cooperating with a conductor provides the superior attenuation characteristics of a "distributed filter".

A body material is used having a minimum permittivity of 4,000,000 at 1 KHz; far higher permittivity than is normally found in standard ferrites used to make radio frequency (RF) noise suppressors and filters. It also provides an initial permeability of over 600. Even distribution of the magnetic substance throughout the material is more important than bulk concentrated, magnetic content. This is contrary to the trend in prior art RF filter design. The distributed method provides high attenuation, sharp cut-off low-pass filter characteristics normally achieved only by large expensive π filters. It does this at low cost and small size, while also eliminating the self-resonant conditions inherent in lumped constant/element filters.

For example: The thin wall of a tube of body material 1 mm. inside diameter, 2 mm. outside diameter, and 8 mm. long surrounds a cable conductor. The conductor is electrically connected to the tube's total inner periphery, and the cable end is terminated to ground by a resistor. An electrode exclusively connects the tube's total outer surface to ground by a very low impedance connection so that the tube forms a true "distributed filter" between ground and the conductor throughout the length of the tube. The tube's filtering characteristic is directly responsive to, among other things, the ratio of the tube length to wall thickness when the tube grain level, inductive and capacitive properties are evenly distributed throughout the body. Typically this filter attenuates 1 MHz at 2 db, 10 Mhz. at 7 db., 30 Mhz at 27 db. and continues at greater than 50 db/decade at higher frequencies, with no resonant inflection. Body material, process variables and shape changes provide a variety of noise suppressing characteristics to suit particular circuit requirements. The tube is easily molded to a shape which will give the most desirable filter characteristic. In some cases tubes having tapered walls have proved to enhance the attenuation factors of the filter assembly.

Contrary to prior art RF noise suppressors the body material of this invention is not considered an insulator, but rather "a controlled conductor". Under DC conditions it behaves more like a complex matrix of resistors and capacitors, each resistor being in parallel with a capacitor. The bulk resistivity is less than 1 MΩ per cm. This lower resistance is desirable for use in high frequency low voltage signal transmission circuits where both source and load impedances are low. Prior art filters have generally strived to keep leakage current to a minimum, but to reduce interference from external sources, resistance values must be kept low. High frequency circuits and transmission lines, of necessity, operate at low voltages, with low resistance components. In these applications it is unnecessary and impractical to require low leakage filtering components. In some cases the body resistance can be reduced to make a filtered transmission cable terminator, eg. at 100 Ω. This type of combined terminator and filter saves cost and space.

Noise by-pass suppressors which are highly capacitive can be made using this invention; typically a 6 mm. square body separating two electrodes by 1 mm. creates a 500 μF capacitor at 1 KHz. High capacitance is achieved by adding opposing electrodes about an intermediate section of high permittivity body material. The material has a high surface porosity which greatly increases the area of electrode contact and thus its effectiveness in producing high capacitance from small dimension components.

A preferred body material is substantially a homogeneous mixture of manganese oxide and iron oxide powder, molded and sintered to form the required component shape. One material group disclosed here, which has exhibited all the required properties to make the embodiments described in the detailed description, is Parite™. Parite™ is an experimental family of fired body materials manufactured by Steward Incorporated 1200 East 36th. Street, Chattanooga, Tenn. Parite™ materials may include voltage surge absorbing properties due to a non-linear conduction curve, effectively avalanching at a specific voltage similar in operation to the well known GE-MOV®II varistors (now manufactured by Harris Semiconductor, Melbourne, Fla.). This "voltage clipping" property occurs in the grain structure and provides a highly desirable transient voltage noise suppression quality; absorbing these external transients from high impedance noise sources while maintaining signal integrity.

Two body-material types operable in the above invention are disclosed here as P and Pv; P material provides the best insertion loss results, and Pv has slightly less insertion loss but includes the voltage clipping capability. The P and Pv materials are primarily made from compress-molded and sintered, oxides of manganese and iron with the addition of a small portion of zinc in some of the compositions. The inclusion of small amounts of other oxides of: aluminum, calcium, cobalt, copper, sodium, nickel, silicon, and lead are effective in enhancing the resistivity, permeability and permittivity properties of the final component.

P and Pv materials are ideal for making noise suppressors. They have a high porosity which effectively increases the surface on which electrodes must be deposited. This extra surface coverage is desirable for increasing the capacitance properties of a noise suppressor, but care must be taken when depositing the electrode material to avoid forming short circuits through the intermediate section of material which separates opposing electrodes and forms the dielectric of the noise suppressing element. Evaporative metalization is a preferred method for forming electrodes on the surfaces of the noise suppressing element. This method uses metal plasma deposition under vacuum for coating the surfaces of the noise suppressor. For surfaces inside passages of the noise suppressor body which must be coated by an electrode, enhanced plasma guidance must be used to direct the evaporated metal into the passage. Other conductive materials may be used for the electrode coating. However, the coating material must be prevented from completely running through body material pores which penetrate and interconnect the surfaces of the intermediate sections separating opposing electrodes. A highly viscous coating material may be used to prevent this from happening. A preferred conductive coating of this type is silver filled conductive epoxe. which can be made to provide the viscosity and low impedance required to form excellent electrodes.

Making Noise Suppressors

Noise suppressing assemblies may be made by adding electrodes to opposing surfaces of an intermediate body section of a molded body. One or more capacitors per body may be made this way. As these capacitors sometimes perform varistor functions it is probably more correct to refer to them as noise suppressing elements. One or more distributed filters may be made by forming passages in the body molding, each passage accepting a through conductor. One or more distributed filters can be made by assembling two or more body moldings so that they form passages enclosing through-conductors and completing the magnetic circuit around the conductors. The capacitance between an electrode or electrodes electrically connected to each through-conductor and an electrode, or electrodes on the outer surface of the passage wall, in cooperation with the magnetic circuit constructed along the through-conductors, provides the required elements for individual distributed filters within the noise suppressor assembly. The intermediate body section forming the noise suppressing element may also be made so that the opposing surfaces are not parallel, in some cases. This provides another way in which certain filtering characteristics of the element may be better suited to the application.

It is well known to accurately mold sintered materials into various shapes and to deposit electrodes onto them, therefore, using this invention combination it is possible to make low cost noise suppressing components to suit the needs described in the Background section of this disclosure.

Objectives

The following new and useful items for suppressing noise in circuits may be derived from this disclosure:
Low cost electronic filters.
Improved radio frequency noise filters.
Transmission line terminators.
Circuit terminators.
RF noise suppressors.
Voltage surge absorbers.
Small high-capacitance power-line noise suppressors.
Multiple monolithic integrated voltage surge absorbers.
Multiple monolithic integrated electronic filters.
Multiple monolithic integrated power-line suppressors.
Multiple monolithic integrated terminators.
Small, low cost, voltage surge absorbers.
Any combination of the above.

DEFINITIONS (For Brevity and Clarity)

Body Material: The granular material which constitutes the collective conductive, dielectric, and magnetic properties.of the invention.

Body material resistivity (p). A measure of the resistivity of the resistance between deposited electrodes on opposing faces of a cube of material expressed as "p Ohms. cm."

Cross-sectional Impedance (Zc): The impedance which exists between electrodes deposited on opposing thin surfaces of an imaginary thin section of a noise suppressor body material. This expression is used to show how the invention operates. A sectional thickness equal to the average grain size may be assumed.

Through conductor: A conductor passing through an aperture, or passage through the body material.

Conductor Impedance (Zi): The incremental impedance of an imaginary thin cross-section of a through-conductor, of a noise suppressor operational as a distributed filter. This expression is used to show how the invention operates. A sectional thickness equal to the average grain size may be assumed.

Incremental Attenuation Factor $Zc \div (Zc + Zi)$: The attenuation factor attributed to one thin section along the length of distributed filter noise suppressor.

Distributed Filter Attenuation: The resulting integral attenuation caused by each incremental attenuation factor in cascaded series connection along the length of a distributed filter noise suppressor.

Crystallites: Semiconducting grains of a polycrystalline material.

Grain Boundaries: Boundaries interconnecting adjacent crystallites.

Grains: Small elements of a body material which include crystallites and grain boundaries.

Varistor: A two or three terminal voltage dependent device having nonlinear conductance, which has a behavior similar to back to back zener diodes. A sudden change in impedance occurs at a voltage generally known as the "varistor voltage". A semiconductor junction at each grain boundary maintains a high resistance at a low voltage and supports a high current flow at a high voltage. The varistor voltage is dependent on grain size, material thickness, and the particular material used, and the heating and cooling process. Symmetrical breakdown characteristics and granular structure enables the device to provide voltage transient suppression, where the granular material can absorb the transient power.

Body Permeability: The measure of how much better a given body material is than air as a path for magnetic lines of force. Body permeability as measured with a conductor passing through a body aperture. Range: about 200 to 650, typically 400.

Body Permittivity: Noise suppressor body material, permittivity or dielectric constant, the ratio of the capacitance of a capacitor made using the body material as a dielectric to the capacitance of an identically formed capacitor but having air as its dielectric.

Body Resistivity: Noise suppressor body resistivity, measured between two electrodes deposited on opposed surfaces.

Heating and Cooling Process: A well known series of steps for making molded polycrystalline component bodies. When making the metal oxide polycrystalline body for this invention, the process includes the following steps:

Mixing powdered oxides into a homogeneous mixture in accordance with the desired finished molecular proportions and grain size.

Forming the powder in a die to the component body shape under pressure.

Sintering the compacted shaped body in an oven at a high temperature, sometimes called firing, and annealing the fired body at a lower temperature for a period.

Cooling is controlled in accordance with the desired the grain boundary resistivity. Resistivity of the body material is controlled by adjusting the cooling rate from anneal temperature to room temperature and also the percentage of oxygen to inert gas surrounding the cooling body. The cooling process is controlled to form the P or Pv material and for increasing or decreasing the varistor threshold voltage.

P material: Sintered polycrystalline material yielding finished grain molecular weight distribution as shown in the tables below. Grain size is about: 10–50 microns in the greatest dimension.

P material provides the following electrical results*:

Signal attenuation is typically—75 db at 300 MHz.

Body Permittivity is typically $5 \times 10^6$ at 1 KHz

Body Resistivity range about: 0.3–0.5 MΩ. cm.

Body Permeability is typically 400 at 1 KHz.

* Based on a tubular filter 1 mm. ID×2 mm. OD×8 mm. long

Pv material: Sintered polycrystalline material yielding finished grain molecular weight distribution as shown in the tables below. Crystallite size is about: 10–50 microns in the greatest dimension.

Pv material provides the following electrical results*:

Signal attenuation is typically:—65 db at 300 MHz.

Body Permittivity is typically: $4.5 \times 10^6$ at 1 KHz

Body Resistivity range about: 0.3–0.5 MΩ. cm.

Body Permeability is typically 400 at 1 KHz.

Varistor resistivity change ratio typically 100:1

Varistor voltage typical range about: 3–20 volts. See Sintering process - cooling, (above).

* Based on a tubular filter 1 mm. ID×2 mm. OD×8 mm. long.

BRIEF DESCRIPTION OF DRAWINGS

FIG. 1: A surface-mountable, distributed filter, noise suppressor component, in perspective.

FIG. 2: FIG. 1 filter, in section.

FIG. 3: The underside of FIG. 1, filter.

FIG. 4: Two noise suppressors partially assembled as a filter.

FIG. 5: A three-filter noise suppressor.

FIG. 6: Imaginary, body and conductor, filter thin sections.

FIG. 7: An equivalent circuit of preferred body material.

FIG. 8: Distributed filter attenuation characteristics.

FIG. 9: Pv material varactor-like characteristics.

FIG. 10: A variable noise suppressor in perspective.

FIG. 11: FIG. 10 noise suppressor, in section.

DETAILS

FIG. 1 shows a rectangular surface-mountable noise suppressor 20 having a body 24 with an electrode 21 coating its outer surface. Body 24 has a through passage with electrode 23 coating the passage walls. Electrodes 21 and 23 are separated by body 24 and by a margin of physical separation where electrode edges are adjacent. A through-conductor 22 passes via the passage and is soldered to electrode 23. A wrap-conductor 25 folds around the top and sides, and under body 24, its ends forming surface mountable terminals. Conductor 25 is soldered or electrically bonded to electrode 21. The ends of through-conductor 22 fold down and under body 24, spaced from electrode 21, to form surface-mountable terminals. Sectional direction 2 is shown.

FIG. 2 is a sectional view in direction 2 in FIG. 1, showing body 24 with through-conductor 22 connected to electrode 23 and opposing ends folded under body 24. The ends are soldered to foils 26 and 28 of a circuit board. Wrap-conductor 25 is shown soldered or electrically bonded to electrode 21 and soldered or electrically bonded to foil 27 of a circuit board. Through-conductor 22 has an input and output connection end, either end being an input end or an output end.

FIG. 3 is an underside view through a circuit board of noise suppressor 20 showing the connections of through conductor 22 to foils 26 and 28 (shown in phantom).

Wrap-conductor 25 is shown connected to foils 27 and 29 (shown in phantom).

FIG. 4 shows a partly assembled and open section view of a surface mountable noise suppressor assembly made from two noise suppressor devices 40 and 40a which fit together forming a through-passage for through-conductor 22. When suppressors 40 and 40a are held in engagement by wrap-conductor 25 a magnetic circuit is formed around conductor 22. Electrodes 43 and 43a (hidden) are deposited on the inner surface of the u-shaped cavities of suppressors 40 and 40a respectively which accepts conductor 22, when assembled. Electrode 41 and 41a are deposited on the outer broad surface and sides of their respective noise suppressors 40 and 40a, but not on the u-shaped ends so that the inner and outer electrodes are physically separated, or on the the contact surfaces 46a, 46b, 46c and 46d, so that there is closure of the magnetic circuit when suppressors 40 and 40a are assembled together.

FIG. 5 shows a surface-mountable, multiple, noise suppressor 50 having three through-conductors 22a, 22b, and 22c, passing through body 54 via parallel, coextensive, passages. Wrap-conductor 52 provides common terminals for multiple conductor noise suppressor 50. Electrodes (not shown) are deposited on the inner peripheral surface of each the passages accepting the through conductors and also on the outer periphery of the body (not shown) in a like manner to that shown in FIGS. 1–3. The four electrodes are separated at their edges so that they do not physically touch each other. Surface-mountable terminals (not shown) also follow the general design shown in FIGS. 1–3. This device includes four extra through-conductor end terminals. This allows filters to be used individually, or interconnected externally in parallel or in series.

FIG. 6 shows a distributed filter, noise suppressor 68 having a body 24, electrodes 21 and 23, and through-conductor 22. Imaginary section 60 of body 24, and section 69 of conductor 22 are shown separated from body 24. Section 60 depicts a section of body material 63, one grain (average) wide, including opposing electrodes 61 and 64. Imaginary section 69 depicts a thin section of conductor 22 equal in thickness to section 60. The figure is a graphic representation of the thin sections referred to in the definition of Cross-sectional Impedance (Zc), Conductor Impedance (Zi), and Incremental Attenuation Factor Zc÷(Zc+ Zi). See Definitions.

FIG. 7 shows a "composite" equivalent circuit of a distributed filter noise suppressor made from P or Pv body material. Circuit 70 presents equivalent components included in the Cross-sectional Impedance (Zc) of an imaginary thin body section. Circuit 79 presents resistivity 76 and Inductance 75 included in the Conductor Impedance (Zi) of an imaginary thin conductor section. A variable frequency ac voltage 14 in series with a d.c. voltage 13 is impressed between conductor input 722a and common electrode 721.

Filter Operation from DC Through High RF

Grain boundary resistivity 71 primarily controls dc current between conductor input 722a and common electrode 721 in the thin body section. Crystallite resistivity 73, is comparatively low and operates in series with the grain boundary components. At lower frequencies ac current flows mainly via the large grain boundary capacitance 72 and the crystallite resistive path 73. At higher frequencies the grain boundary reactance of capacitance 72 diminishes, therefore, crystallite resistivity 73 controls the ac current. At high RF crystallite capacitance 74 significantly bypasses the crystallite resistive path and becomes the controlling element. Current path shifts within the material occur without causing any of the resonant conditions normally expected from ceramic circuits.

Incremental Impedance (Zi) in conductor 22 includes resistivity 76, and inductance 75. Resistivity 76 is negligible, but Zi increases with frequency due to the inductive reactance of inductance 75; effected by the body permeability. However, body permeability does fall off at high RF and Zi is not proportional to the input frequency. Zi cooperates with the Cross-sectional Impedance (Zc) to produce an Incremental Attenuation Factor Zc÷(Zc+ Zi). The equivalent circuit depicts a plurality of cascaded incremental attenuating circuits, operating in series along the length of the body. A termination resistor 15 is shown connected between conductor end 722b and the common outer electrode 721.

Varistor Operation

Switching device 77 (operative in Pv material only) short circuits the grain boundary resistivity 71 and capacitance 72, leaving only the crystallite resistivity 73 and capacitance 74 operative in circuit 70. This simplistic view of the varistor mechanism closely follows measured results. The ratio between resistivity 71 and resistivity 73 is typically 100:1.

FIG. 8 shows attenuation characteristics expected from a distributed filter noise suppressor made according to this invention. Curve 84 is typical of Pv body material and curve 85 is typical of P body material. Section 83 attenuates at 50 db per decade. Point 82 indicates - 18 db at 30 MHz. Point 81 indicates - 7 db at 10 MHz.

FIG. 9 shows a family of varistor like characteristics which can be expected from a noise suppressor made using Pv body material. Curves 91, 92, 93, and 94, are all symmetrical about the zero axis point. The high to low resistivity ratio is typically 100:1. Varistor voltages are dependent on electrode; separation, a thicker body section increases the varistor voltage. The metal oxide mix and oxygen introduction during the heating and cooling process, may be used to control the varistor voltage.

FIG. 10 shows a noise suppressor 100 having adjustable noise filtering characteristics. Conductor 122 having end terminals 132 and 133 extends through the axial passage of an elongated cylindrical body 124 made from noise suppressor body material, and further extends through the axial passage of a conductive threaded screw 125. An electrode 123 (not shown) disposed on the axial passage wall of body 124 is soldered to conductor 122. Threaded screw 125 is insulated from conductor 122 by insulating sleeve 131, and affixed adjacent body 124 by an adhesive. Sleeve electrode 121 made from compliant spring material is in slideable contact with the outer periphery of body 124. Electrically conductive nut 130 is threaded onto screw 125 and is attached to sleeve electrode 121. Electrode 121 covers a contact area of body 124 which may be finely adjusted by rotating nut 130. Terminal 134 projects from screw 125 coextensive and parallel with terminals 132, and 133 for connection to a circuit board.

FIG. 11 shows a section through a portion of noise suppressor 100 in direction 11. See FIG. 10.

A Typical Process for Making P Material

A method for making a body of sintered crystalline material for an electrical noise suppressing component having a finished grain molecular weight distribution of the body of: 45 to 56% $Fe_2O_3$, 36 to 57% MnO, 0 to 12% ZnO, (50 to 52% $Fe_2O_3$, 47 to 49% MnO, 0 to 2% ZnO preferred) and 0 to 0.2% of at least one additive element selected from a group consisting of $Al_2O_3$, CaO, CoO, CuO, $Na_2O$, NiO, $SiO_2$, PbO, comprises the steps of:

mixing thoroughly, a selection of metal oxide constituent ingredients comprising: MnO, Fe$_2$O$_3$, ZnO, and at least one additive element selected from a group consisting of Al$_2$O$_3$, CaO, CoO, CuO, Na$_2$O, NiO, SiO$_2$, PbO into a homogeneous oxide powder;

calcining the homogeneous oxide powder in a kiln with a retention time of about 20 to 60 minutes at a peak temperature of about 1000° to 1,200° C. to form a calcined material;

milling the calcined material in a ball mill with water and organic binders to produce a milled slurry having an average particle diameter of about 1.2 to 1.7 microns;

drying the milled slurry to agglomerate and produce a molding powder having an average diameter of about 50 to 100 microns;

forming the molding powder into a shaped compacted body in a compacting press under a pressure of about 80 to 120 MPa;

removing the organic binders by raising the temperature of the shaped compacted body to 360° C. at about 150° C. per hour and holding the shaped compacted body at 360° C. for approximately 2 hours, in a surrounding gas, providing an oxidizing environment;

reacting the shaped compacted body with the organic binders removed by elevating its temperature to reach a peak reacting temperature of about 1,200° to 1,320° C. at a rate of 130° C. per hour, and by holding the compacted body within about 40° C. of the peak reacting temperature for about 2 to 4 hours, in the oxidizing environment to make a fired body;

annealing the fired body by reducing its temperature to an annealing temperature of about 1,175° C. and holding that temperature with O$_2$ being at 1 to 10% of the surrounding gas;

cooling the fired body from the annealing temperature to an oxidizing temperature of less than 400° C. at about 75° C. per hour with O$_2$ being less than 0.02% of the surrounding gas.

A Typical Process for Making Pv Material

A method for making a body of sintered crystalline material for an electrical noise suppressing component which has a varistor-like, non-linear resistivity characteristic, having a finished grain molecular weight distribution of the body of: 45 to 56% Fe$_2$O$_3$, 36 to 57% MnO, 0 to 12% ZnO, and 0 to 0.2% of at least one additive element selected from a group consisting of Al$_2$O$_3$, CaO, CoO, CuO, Na$_2$O, NiO, SiO$_2$, PbO, comprises the steps of:

mixing thoroughly, a selection of metal oxide constituent ingredients comprising: MnO, Fe$_2$O$_3$, ZnO, and at least one additive element selected from a group consisting of AlO$_3$, CaO, CoO, CuO, Na$_2$O, NiO, SiO$_2$, PbO into a homogeneous oxide powder;

calcining the homogeneous oxide powder in a kiln with a retention time of about 20 to 60 minutes at a peak calcining temperature of about 1000° to 1,200° C. to form a calcined material;

milling the calcined material in a ball mill with water and organic binders to produce a milled slurry having an average particle diameter of about 1.2 to 1.7 microns;

drying the milled slurry to agglomerate and produce a molding powder having an average diameter of about 50 to 100 microns.

forming the molding powder into a shaped compacted body in a compacting press under a pressure of about 80 to 120 MPa removing the organic binders by raising the temperature of the shaped compacted body to 360° C. at about 150° C. per hour in an oven and holding the shaped compacted body at 360° C. for approximately 2 hours, in a surrounding gas, providing an oxidizing environment;

reacting the shaped compacted body with the organic binders removed by elevating its temperature to reach a peak reacting temperature of about 1,200° to 1,320° C. at a rate of 130° C. per hour, and by holding the compacted body within about 40° C. of the peak reacting temperature for about 2 to 4 hours, in the oxidizing environment to make a fired body;

annealing the fired body by reducing its temperature to an annealing temperature of about 1,175° C. and holding that temperature with O$_2$ being 1 to 10% of the surrounding gas the remainder of the gas being nitrogen;

primarily cooling the fired body from the annealing temperature to an oxidizing temperature of less than 400° C. at about 75° C. per hour with O$_2$ being less than 0.02% of the surrounding gas;

finally cooling the fired body from the oxidizing temperature to less than 200° C. in air to produce the body of sintered crystalline material.

P and Pv Material Examples

Examples of combinations of finished grain molecular weight distribution of oxides contained in the body material of the noise suppressor devices covered in this disclosure are shown in the tables below:

| Oxide | Example 1 | 2 | 3 | 4 |
|---|---|---|---|---|
| MnO | 42.36 | 51.01 | 44.93 | 51.91 |
| Fe$_2$O$_3$ | 52.77 | 48.74 | 51.79 | 47.84 |
| ZnO | 4.62 | 0.0 | 3.02 | 0.0 |
| Al$_2$O$_3$ | 0.05 | 0.08 | 0.06 | 0.08 |
| CaO | 0.04 | 0.07 | 0.05 | 0.07 |
| CoO | 0.003 | 0.008 | 0.005 | 0.009 |
| CuO | 0.006 | 0.003 | 0.005 | 0.004 |
| Na$_2$O | 0.05 | 0.02 | 0.04 | 0.02 |
| NiO | 0.003 | 0.008 | 0.005 | 0.009 |
| SiO$_2$ | 0.012 | 0.012 | 0.011 | 0.012 |
| PbO | 0.001 | 0.001 | 0.005 | 0.005 |

| Oxide | Example 5 | 6 | 7 | 8 |
|---|---|---|---|---|
| MnO | 48.99 | 41.72 | 39.10 | 47.94 |
| Fe$_2$O$_3$ | 50.76 | 51.82 | 52.85 | 51.80 |
| ZnO | 0.001 | 6.21 | 7.8 | 0.001 |
| Al$_2$O$_3$ | 0.07 | 0.06 | 0.05 | 0.06 |
| CaO | 0.06 | 0.05 | 0.04 | 0.05 |
| CoO | 0.006 | 0.005 | 0.002 | 0.005 |
| CuO | 0.004 | 0.005 | 0.007 | 0.005 |
| Na$_2$O | 0.04 | 0.04 | 0.06 | 0.04 |
| NiO | 0.006 | 0.005 | 0.002 | 0.005 |
| SiO$_2$ | 0.011 | 0.011 | 0.011 | 0.012 |
| PbO | 0.005 | 0.005 | 0.005 | 0.001 |

| Oxide | Example 9 | 10 | 11 | 12 | 13 |
|---|---|---|---|---|---|
| MnO | 38.54 | 49.92 | 36.22 | 43.54 | 56.63 |
| Fe$_2$O$_3$ | 51.81 | 49.83 | 55.83 | 53.82 | 42.82 |
| ZnO | 9.40 | 0.001 | 7.70 | 2.39 | 0.0 |
| Al$_2$O$_3$ | 0.05 | 0.07 | 0.08 | 0.05 | 0.09 |
| CaO | 0.04 | 0.06 | 0.07 | 0.04 | 0.08 |
| CoO | 0.004 | 0.007 | 0.009 | 0.004 | 0.01 |
| CuO | 0.006 | 0.004 | 0.002 | 0.008 | 0.01 |
| Na$_2$O | 0.05 | 0.03 | 0.02 | 0.05 | 0.01 |

| | | | | | |
|---|---|---|---|---|---|
| NiO | 0.004 | 0.007 | 0.004 | 0.004 | 0.1 |
| SiO$_2$ | 0.012 | 0.011 | 0.012 | 0.012 | 0.2 |
| PbO | 0.001 | 0.005 | 0.005 | 0.001 | 0.01 |

P and Pv materials contain an unusually large amount of MnO, have uncommonly high permittivity at the grain level and may not be considered ferrites. Known ferrites having a high percentage of MnO and very small percentages of NiO are not generally considered by the Ceramic Industry as useful at frequencies above 2 MHz.

The inclusion of small amounts of modifier elements in addition to oxides of manganese, iron, and zinc effects crystallite semiconductor behavior. It is desirable to control resistivity and permittivity to suit the particular needs of the final component. Grain boundary resistivity increases when silicon lead and calcium oxides are introduced. Zinc oxide increases resistivity, and Nickel oxide also increases resistivity, but lowers permittivity. Cobalt oxide modifies the permeability. Oxides of aluminum, copper and sodium are often present as trace elements and can effect the formation of the crystallite. The removal of one or more of these modifier elements may have effects not yet known. It is usual to find trace elements present as impurities of the iron and manganese oxides and it is difficult to detect them, therefore it is considered prudent at this time to include all the specified elements.

The above specific examples are not intended to limit the scope of the invention described in this application.

What I claim is:

1. An electrical noise suppressing component comprising:
   a) a body made from a sintered polycrystalline body material having cohesively integrated metal oxide grains, wherein magnetic, dielectric, and resistive properties are substantially evenly distributed throughout the body, providing a minimum body permittivity of 4,000,000 at 1 KHz, and a body resistivity less than 1 MΩ per cm.;
   b) at least one noise suppressing element formed by the body, comprising a first surface being separated from a second surface by an intermediate section of the body material;
   c) a first electrode disposed upon the first surface, defining a first area of electrical contact with the intermediate section;
   d) a second electrode disposed upon the second surface, defining a second area of electrical contact with the intermediate section.

2. The electrical noise suppressing component recited in claim 1 wherein the body material has a finished grain molecular weight distribution of: 36 to 57% MnO, 45 to 56% Fe$_2$O$_3$, 0 to 12% ZnO, and 0 to 0.2% of at least one additive element selected from the group consisting of Al$_2$O$_3$, CaO, CoO, CuO, Na$_2$O, NiO, SiO$_2$, PbO.

3. The electrical noise suppressing component recited in claim 2 wherein the body material includes a non-linear conductance property such that when a voltage in excess of a specified threshold voltage level is impressed between the first and second electrodes of the noise suppressing element the resistivity of the body material in the intermediate section will reduce in an avalanching manner.

4. The electrical noise suppressing component recited in claim 1, wherein said at least one noise suppressing element comprises a plurality of the noise suppressing elements formed by the body.

5. The electrical noise suppressing component recited in claim 1, wherein the body material is porous.

6. The electrical noise suppressing component recited in claim 1, wherein the intermediate section of the noise suppressing element is shaped as an elongated tube having an inner peripheral surface, being the second surface, and an outer peripheral surface being the first surface, the first and second surfaces being coaxial, the noise suppressing element having a noise suppressing characteristic substantially defined by the axial length over which the first and second areas of electrical contact with the intermediate section are coextensive.

7. The electrical noise suppressing component of claim 6, further comprising a through-conductor having an input end, and an output end, extending through the elongated tube proximate, and electrically connected to the second electrode of the noise suppressing element.

8. The electrical noise suppressing component recited in claim 7, wherein the noise suppressing component includes means for mechanically adjusting the axial distance over which the first and second electrodes of the noise suppressing element are coextensive.

9. An electrical noise suppressing component comprising:
   a) a body made from a sintered polycrystalline body material having cohesively integrated metal oxide grains, wherein magnetic, dielectric, and resistive properties are substantially evenly distributed throughout the body, providing a minimum body permittivity of 4,000,000 at 1 KHz, and a body resistivity less than 1 MΩ per cm.;
   b) an outer electrode being disposed on the outer peripheral surface of the body;
   c) a plurality of coextensive, axially parallel, passages formed through the body, wherein the body material surrounding each individual passage, forms an individual inner peripheral passage surface;
   d) a plurality of inner electrodes of equal number to the number of passages, wherein each one of the inner electrodes is disposed on and relates to one of the passage's surfaces, one inner electrode for one passage surface;
   e) a means for electrically insulating each inner electrode preventing direct electrical connection with any of the other inner electrodes and from direct electrical connection with the outer electrode.

10. The electrical noise suppressing component as recited in claim 9 further comprising:
    a) a plurality of through-conductors of equal number to that of the number of passages, each of the through-conductors individually having an input end and an output end;
    b) each one of the through-conductors being related to, associated with, and extending through, one of the passages, wherein it fits proximate to the passage surface, and is electrically connected to the inner electrode of the passage.

11. A noise suppressor assembly having a through-passage comprising:
    a) a plurality of noise suppressor devices;
    b) each said noise suppressor device comprising:
       i) a body made from a sintered polycrystalline body material having cohesively integrated metal oxide grains, wherein magnetic, dielectric, and resistive properties are substantially evenly distributed throughout the body, providing a minimum body permittivity of 4,000,000 at 1 KHz, and a body resistivity less than 1 MΩ per cm.; and ii) said body having a first surface and a second surface, said first surface separated from said second surface by an intermediate section of said body material, a first electrode disposed upon said first surface, a second electrode disposed upon said second surface; and iii) said body being shaped to form a segment of said noise suppressor assembly, having at least two contact surfaces;

c) each of said noise suppressor devices joining with the other said noise suppressor devices in said noise suppressor assembly via said contact surfaces;

d) said noise suppressor assembly having an inner peripheral surface adjacent said through-passage and an outer peripheral surface, said inner and outer peripheral surfaces being coaxial;

e) said second surfaces of the noise suppressing devices substantially forming said inner peripheral surface;

f) said first surfaces of said noise suppressing elements substantially forming said outer peripheral surface of said filter assembly.

12. The filter assembly of claim 11 further comprising:

a) said first electrodes of each of said noise suppressing devices of said noise suppressor assembly electrically connected to a common connection terminal;

b) a through-conductor having an input end and an output end extending through said through-passage, wherein said through-conductor fits proximate said inner peripheral surface, and is electrically connected to said second electrode of each and every one of said noise suppressor devices.

* * * * *